United States Patent [19]

Cox et al.

[11] Patent Number: 5,544,070

[45] Date of Patent: Aug. 6, 1996

[54] PROGRAMMED PROGRAMMABLE DEVICE AND METHOD FOR PROGRAMMING ANTIFUSES OF A PROGRAMMABLE DEVICE

[75] Inventors: William D. Cox, Milpitas; Andrew K. L. Chan, Palo Alto; Richard J. Wong, Milpitas; James M. Apland, San Jose; Kathryn E. Gordon, Mountain View, all of Calif.

[73] Assignee: QuickLogic Corporation, Santa Clara, Calif.

[21] Appl. No.: 937,331

[22] Filed: Aug. 27, 1992

Related U.S. Application Data

[63] Continuation-in-part of Ser. No. 738,707, Jul. 31, 1991, Pat. No. 5,302,546, and a continuation-in-part of Ser. No. 907,904, Jul. 2, 1992, Pat. No. 5,327,024.

[51] Int. Cl.$^6$ ............................................. H03K 19/177
[52] U.S. Cl. ............................ 364/489; 364/488; 326/38; 326/41
[58] Field of Search ...................... 364/489, 488; 437/172; 257/529, 530; 326/38–41, 47

[56] References Cited

U.S. PATENT DOCUMENTS

| | | | |
|---|---|---|---|
| 4,595,875 | 6/1986 | Chan et al. | 324/522 |
| 4,651,409 | 3/1987 | Ellsworth et al. | 437/52 |
| 4,698,589 | 10/1987 | Blankenship et al. | 365/201 |
| 4,748,490 | 5/1988 | Hollingsworth | 257/530 |
| 4,758,745 | 7/1988 | Elgamal et al. | 326/16 |
| 4,783,763 | 11/1988 | Bergman | 365/94 |
| 4,823,181 | 4/1989 | Mohsen et al. | 257/530 |
| 4,857,774 | 8/1989 | El-Ayat et al. | 326/16 |
| 4,873,459 | 10/1989 | El Gamal et al. | 326/41 |
| 4,910,417 | 3/1990 | El Gamal et al. | 326/41 |
| 4,933,898 | 6/1990 | Gilberg et al. | 365/53 |
| 4,969,124 | 11/1990 | Luich et al. | 365/201 |
| 5,008,855 | 4/1991 | Eltoukhy et al. | 365/96 |
| 5,070,384 | 12/1991 | McCollum et al. | 257/530 |
| 5,126,282 | 6/1992 | Chiang et al. | 257/530 |
| 5,130,777 | 7/1992 | Galbraith et al. | 257/530 |
| 5,140,554 | 8/1992 | Schreck et al. | 365/201 |
| 5,166,556 | 11/1992 | Hsu et al. | 326/41 |
| 5,187,393 | 2/1993 | El Gamal et al. | 326/41 |
| 5,194,759 | 3/1993 | El-Ayat et al. | 327/525 |
| 5,196,724 | 3/1993 | Gordon et al. | 257/530 |
| 5,294,846 | 3/1994 | Paivinen | 307/465 |
| 5,302,546 | 4/1994 | Gordon et al. | 437/170 |
| 5,319,238 | 6/1994 | Gordon et al. | 257/530 |
| 5,327,024 | 7/1994 | Cox | 307/465 |
| 5,349,248 | 9/1994 | Parlour et al. | 364/490 |

FOREIGN PATENT DOCUMENTS 0416903  3/1991  European Pat. Off.

OTHER PUBLICATIONS

Chiang et al., "Oxide–Nitride–Oxide Antifuse Reliability", IEEE; Cat. No. 90CH2787–0, Mar. 1990, pp. 186–192.

(List continued on next page.)

*Primary Examiner*—Vincent N. Trans
*Attorney, Agent, or Firm*—Skjerven, Morrill, MacPherson, Franklin & Friel; Alan H. MacPherson; T. Lester Wallace

[57] ABSTRACT

A programmable device comprises a first antifuse programmed with a first programming method and a second antifuse programmed with a second programming method, whereby an actual operating current flowing through the second antifuse exceeds a maximum permissible operating current of the first antifuse but does not exceed a maximum permissible operating current of the second antifuse, whereby an actual operating current flowing through the first antifuse does not exceed the maximum permissible operating current of the first antifuse, and whereby an actual operating current flowing through the second antifuse does not exceed the maximum permissible operating current of the second antifuse. By allowing the use of a programming method on some antifuses which would not be adequate for the programming of other antifuses, the realization of user-specific circuits in field programmable devices is facilitated and the reliability of user-specific circuits realized in field programmable devices is enhanced.

34 Claims, 7 Drawing Sheets

OTHER PUBLICATIONS

Essat Handy, et al., "Dielectric Based Antifuse For Logic and Memory ICs", IEEE 1988, 786–IEDM 88, 4 pages.

Cook, B., et al., "Amorphous Silicon Antifuse Technology For Bipolar PROMs", 1986 Bipolar Circuits and Technology Meeting, IEEE 1986, pp. 99–100.

Liu, D. et al., "Scaled Dielectric Antifuse Structure for Field–Programmable Gate Array Applications", IEEE Electron Device Letter, vol. 12, No. 4, Apr. 1991, pp. 151–153.

QuickLogic Preliminary Data Sheet: "pASIC™ 1 Family ViaLink™ Technology Very High Speed CMOS FPGAs", May 1991, pp. 1–32.

QuickLogic Data Sheet: "An Introduction to QuickLogic's pASIC Devices and SpDE Development Environment", Apr. 1991, pp. 1–12.

J. Birkner et al., "A Very High–Speed Field Programmable Gate Array Using Metal–To–Metal Antifuse Programmable Elements", IEEE 1991, Custom Integrated Circuits Conference, Session 1, May 12, 1991, 8 pages.

QuickLogic, "pASIC Toolkit User's Guide" Revision 1.0, Jun. 1991.

Yau, L., "Determination of the Fowler–Nordheim Tunneling Barrier from Nitride to Oxide in Oxide: Nitride Dual Dielectric", IEEE Electron Device Letters, vol. EDL–7, No. 6, Jun. 1986, pp. 365–367.

A. El Gamal et al., "An Architecture for Electrically Configurable Gate Arrays", IEEE Journal of Solid–State Circuits, vol. 24, No. 2, Apr. 1989, pp. 394–398.

PROGRAMMED PROGRAMMABLE DEVICE AND METHOD FOR PROGRAMMING ANTIFUSES OF A PROGRAMMABLE DEVICE

CROSS REFERENCE TO RELATED APPLICATIONS

This application is a continuation-in-part of U.S. patent application Ser. No. 07/738,707, filed Jul. 31, 1991, now U.S. Pat. No. 5,302,546, and is also a continuation-in-part of U.S. patent application Ser. No. 07/907,904, filed Jul. 2, 1992, now U.S. Pat. No. 5,327,024.

FIELD OF THE INVENTION

This invention relates to the programming of antifuses. More specifically, this invention relates to the programming of antifuses in a programmable device such as a field programmable gate array (FPGA).

BACKGROUND OF THE INVENTION

A field programmable device (or a so-called field programmable gate array or "FPGA") is a versatile integrated circuit chip, the internal circuitry of which may be configured by an individual user to realize a user-specific circuit. To configure a field programmable device, the user configures an on-chip interconnect structure of the field programmable device so that selected inputs and selected outputs of selected on-chip logic components are connected together in such a way that the resulting circuit is the user-specific circuit desired by the user.

FIG. 1A is a top down simplified diagram illustrating a corner portion of a field programmable device. Sides S1, S2 and S3 are three sides of the die of the field programmable device. A plurality of antifuses L1–L25 are programmable so that the digital circuitry contained in modules M1–M8 can be connected together to realize user-specific circuits. In contrast to "fuses" conventionally used in programmable read only memory devices (PROMs) or programmable logic devices (PLDs) which are conductive before being blown and are nonconductive after being blown, "antifuses" such as the antifuses shown in FIG. 1A are nonconductive before being programmed and are conductive after being programmed.

FIG. 1B is a cross sectional view of an antifuse of FIG. 1A, such as antifuse L1. Antifuse L1 comprises a thin dielectric body layer 121 and a layer of diffusible conductive material 122 sandwiched between a horizontal wire W12 and a vertical wire W13 so that a first surface portion 126 of the antifuse contacts vertical wire W13 and so that a second surface portion contacts horizontal wire W12. The horizontal wire W12 may, for example, be located on a first metallization layer of the programmable device whereas the vertical wire W13 may be located on a second metallization layer of the programmable device. An insulating layer 128 may be disposed between the first metallization layer and the second metallization so that the antifuse forms a via-like structure from the vertical wire W13 down to the horizontal wire W12. In its unprogrammed state, horizontal wire W13 is insulated from vertical wire W13 by dielectric body layer 121. In its programmed state, a conductive path 129 is formed through body layer 121 so that horizontal wire W12 and vertical wire W13 are substantially electrically connected. Such an antifuse which can be programmed to connect two orthogonally oriented wires is called a "cross" antifuse; whereas an antifuse which can be programmed to connect two adjacent ends of two collinear wires is called a "pass" antifuse. Antifuses L1, L2, L5, L6, L9, L10, L13, and L19–L25 in FIG. 1A are cross antifuses. Antifuses L14, L16, L3, L4, L17, L7, L8, L18, L11 and L12 in FIG. 1A are pass antifuses.

If, for example, the circuit shown in FIG. 2A is to be realized in the corner portion of the field programmable device of FIG. 1A, flip-flop FF2 in module M3 of FIG. 1A may serve as flip-flop 21 of FIG. 2A, whereas AND gate AND2 in module M4 of FIG. 1A may serve as AND gate 22 of FIG. 2A. By programming antifuses L9, L12, and L13 to be conductive, a net is established extending from the output of flip-flop FF2 to a non-inverting input of AND gate AND2. This net corresponds with the net 23 of FIG. 2A.

Accordingly, an electrical connection is made from an output of flip-flop FF2, to horizontal wire W1, through programmed cross antifuse L9, to vertical wire W2, through programmed pass antifuse L12, to vertical wire W21, through programmed cross antifuse L13, to horizontal wire W3, and to a non-inverting input of AND gate AND2. Transistors T1–T8 are turned off during normal circuit operation so none of wires W4–W11 is connected to the net between flip-flop FF2 and AND gate AND2.

The circuit shown in FIG. 2B having a larger net 24 may also be realized in the corner portion of the field programmable device of FIG. 1A. The flip-flop FF1 in module M1 of FIG. 1A may serve as flip-flop 25 of FIG. 2B, the AND gate AND1 in module M2 of FIG. 1 may serve as AND gate 26 of FIG. 2B, the output buffer B1 and pad P1 of FIG. 1A may serve as the first output buffer 27 and pad 28 of FIG. 2B, and the output buffer B2 and pad P2 of FIG. 1A may serve as the second output buffer 29 and pad 30 of FIG. 2B. To realize this larger net 24 in the field programmable device of FIG. 1A, seven antifuses L1–L7 are programmed to be conductive.

Accordingly, an electrical connection is made from an output of flip-flop FF1, to horizontal wire W12, through programmed cross antifuse L1, to vertical wire W13, through programmed cross antifuse L2, to horizontal wire W14, through programmed pass antifuse L3, to horizontal wire W15, and to output buffer B1 and pad P1. This net also extends from vertical wire W13, through programmed pass antifuse L4, to vertical wire W16, through programmed cross antifuse L5, to horizontal wire W17, and to a non-inverting input of AND gate AND1. This net also extends from vertical wire W16, through programmed cross antifuse L6, to horizontal wire W18, through programmed pass antifuse L7, to horizontal wire W19, and to output buffer B2 and pad P2. The two above described nets are disconnected from each other during normal circuit operation after antifuse programming because pass antifuse L8 is not programmed and because pass transistors PT1–PT10 are not turned on during normal circuit operation.

Such nets of a user-specific circuit may be realized in a field programmable device using the following method. First, the various gates and other circuitry of the user-specific circuit are "placed" in the various modules of a field programmable device. A flip-flop FF2 corresponding with flip-flop 21 of FIG. 2A is, for example, placed in module M3 whereas the AND gate AND2 corresponding with AND gate 22 is placed in module M4. Second, the nets of the user-specific circuit are "routed" between modules so that the antifuses to be programmed can be identified. In the above-described example, a net corresponding with connection 23 of FIG. 2A is routed through wire W1, antifuse L9, wire W2, L12, W21 antifuse L13, and wire W3. Third, a program sometimes called a "sequencer" is used to determine the order in which the antifuses in the routed nets will be programmed and the method by which each of those antifuses will be programmed.

A list of all the antifuses to be programmed for realizing a given user-specific circuit is typically supplied to the sequencer. From this list, the sequencer generates an ordered list indicating: 1) the sequence in which the antifuses are to be programmed, and 2) which of the pass transistors PT1–PT10 and which of the program drivers PD1–PD9 of the field programmable device are to be turned on and which are to be turned off to program each of the antifuses in the sequence. If, for example, cross antifuse L1 is to be programmed, a first programming driver PD8 may be controlled to drive a vertical wire W20 with a programming voltage (Vpp) and a second programming drive PD1 may be controlled to drive a horizontal wire W4 with a ground voltage. Because transistors T1 and PT1 are controlled to be turned on, a programming voltage between vertical wire W13 and horizontal wire W12 is dropped across antifuse L1. Antifuse L1 is thereby programmed to be permanently conductive. The order of programming of the antifuses is particularly important because programming certain antifuses first may render it impossible to program other of the antifuses later. Accordingly, the sequencer outputs a programming sequence which allows the programming of all the antifuses to be programmed.

Special wires having no pass transistors or pass antifuses called express wires may also be provided to provide low impedance programming access deep into the interconnect matrix of wires. One such express wire EW1 is shown in FIG. 1A running vertically and being connected to programming driver PD10.

The above described method of placing circuitry in the various modules of the field programmable device, routing nets, and determining how antifuses in the nets are to be programmed is, in some embodiments, an iterative process. Before the final realization of the user-specific circuit is determined, multiple placements may be tried, multiple net configurations may be tried with a given placement, and multiple programming sequences and programming methods may be tried using a given net configuration.

When such a place, route and sequence method is used to realize a user-specific circuit in a program field programmable device, however, reliability problems are sometimes encountered. Some field programmable devices programmed to have large nets fail, whereas other field programmable devices programmed which are programmed to have no large nets do not fail.

SUMMARY OF THE INVENTION

It has been discovered that some of the reliability problems associated with field programmable devices occur due to changes in the speed of signals travelling on certain large nets during normal circuit operation and after antifuse programming. Once a field programmable device is programmed to realize a user-specific circuit, the relative speeds of signals travelling on the various nets within the field programmable device should remain substantially constant with respect to each other. If the speed of one signal speeds up or slows down with respect to another signal, the operation of the circuitry inside the various modules may change resulting in a different function being performed by the circuitry than is desired. If such a change in circuit function is unacceptable, the field programmable device is characterized as having "failed" or as being "unreliable".

Such signal speed changes have been found to be due, at least in part, to changes in the electrical characteristics of programmed antifuses disposed in large nets. Certain programmed antifuses disposed in large nets have been found to conduct higher switching currents during switching during normal circuit operation than do other antifuses disposed in smaller nets. It has been discovered that if the operating current flowing through a programmed antifuse is adequately high, then the physical structure of the programmed antifuse may be affected by the high operating current, thereby changing electrical characteristics of the antifuse.

FIG. 3A shows the operating current flowing (during normal circuit operation) through antifuse L9 of the relatively small net of FIG. 2A as realized in the field programmable device of FIG. 1A. FIG. 3B shows the operating current flowing (during normal circuit operation) through antifuse L1 of the relatively large net of FIG. 2B as realized in the field programmable device of FIG. 1A. Note that the peak of the operating current shown in FIG. 3B flowing through antifuse L1 (5.00 mA) is greater in the larger net than is the peak of the operating current shown in FIG. 3A flowing through antifuse L9 (3.46 mA) in the smaller net. The peaks of the antifuse operating currents are seen to occur during the voltage transitions of the outputs of the flip-flops FF1 and FF2 because the circuitry connected to the simulated net is complementary metal oxide silicon (CMOS) circuitry.

It has also been discovered, however, that the maximum permissible operating current of a programmed antifuse is at least somewhat dependent upon the way in which the programmed antifuse is initially programmed. The maximum operating current that a programmed antifuse can conduct before its series resistance is affected is called the maximum permissible operating current of the antifuse. A relationship, for example, has been found to exist in the antifuse of FIG. 1B between the magnitude of the peak of the programming current used to program an antifuse and the maximum permissible operating current that the programmed antifuse can sustain during normal circuit operation before its series resistance is affected. An antifuse programmed with a peak programming current of 35 mA may, for example, have a maximum permissible operating current of 26 mA, whereas the same antifuse programmed with a peak programming current of 10 mA may have a maximum permissible operating current of 8 mA.

Accordingly, one embodiment of the present invention is a method comprising the steps of:

(a) before antifuse programming, identifying an antifuse to be programmed which will likely undergo a change in resistance during normal circuit operation if a default programming method is used to program the identified antifuse; and (b) before antifuse programming, limiting the programming methods usable to program the identified antifuse so that the identified antifuse will be programmed with greater programming current than it would have been had the default programming method been used.

In some embodiments, this identification of antifuses which will likely undergo a change in resistance during normal circuit operation is carried out by determining the operating current that would flow through an antifuse if the default programming method were used to program the antifuse and by determining the programming current that would flow through the antifuse if the antifuse were programmed with the default programming method. If the peak operating current divided by the peak programming current exceeds a predetermined number, then the antifuse is identified as an antifuse, the resistance of which is likely to change during normal circuit operation. If, on the other hand, the peak operating current divided by the programming current does not exceed the predetermined number, then the antifuse is not identified as an antifuse, the resistance of which is likely to change during normal circuit operation.

By identifying particular antifuses on a programmable device that will likely undergo a change in resistance if programmed using a default programming method, the present invention allows other antifuses on the programmable device to be programmed using programming methods that cannot be reliably used to program the identified antifuses. Because the limiting of programming methods usable to program an antifuse can complicate the determination of how to program the other antifuses to be programmed, the present invention's limiting of programming methods of only some of the antifuses to be programmed facilitates the realization of reliable user-specific circuits in programmable devices.

DETAILED DESCRIPTION OF THE PREFERRED EMBODIMENTS

Figure 4:
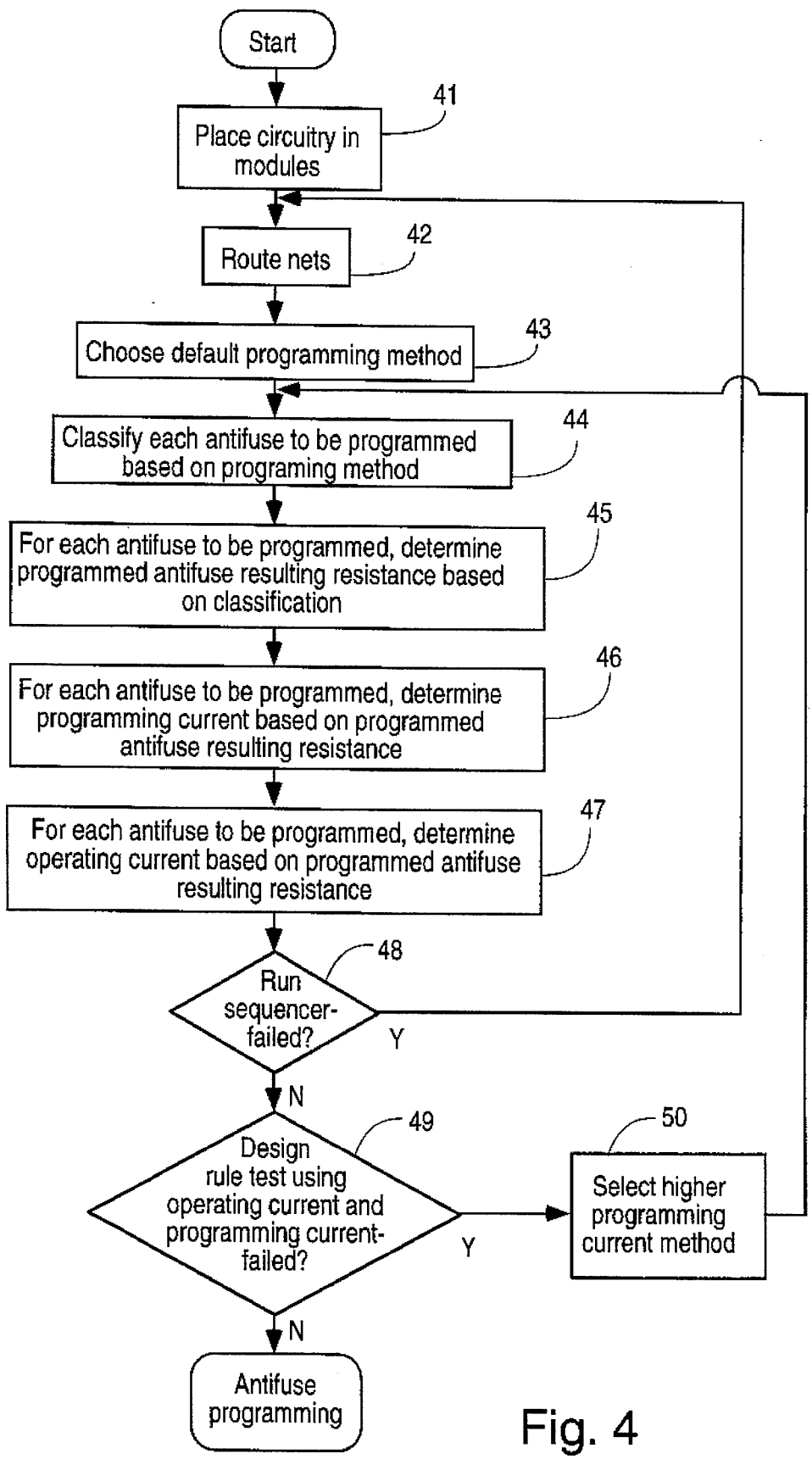
FIG. 4 is a flowchart showing a sequence of steps in accordance with one embodiment of the present invention.

FIG. 4 is a flowchart depicting a sequence of steps of a method in accordance with one embodiment of the present invention.

First, in step 41, the circuitry of a user-specific circuit is placed in the various modules of a programmable device. Similarly, the input/output pads and buffers of the programmable device which will be used by the user-specific circuit are chosen. If, for example, the two circuits of FIGS. 2A and 2B are to be realized in the programmable device of FIG. 1A, then flip-flop FF2 of module M3 may serve as flip-flop 21, and AND gate AND2 may serve as AND gate 22, flip-flop FF1 of module M1 may serve as flip-flop 25, AND gate AND1 of module M2 may serve as AND gate 26, buffer and pad B1 and P1 may serve as buffer and pad 27 and 28, and buffer and pad B2 and P2 may serve as buffer and pad 29 and 30.

Next, in step 42, the nets of the user-specific circuit are preliminarily routed to connect electrically the appropriate circuitry of the programmable device which has previously been placed. If, for example, the user-specific circuit of FIGS. 2A and 2B is to be realized in the programmable device of FIG. 1A, then wires and antifuses W1, L9, W2, L12, W21, L13, and W3 may form net 23 of FIG. 2A in the programmable device of FIG. 1A. Similarly, wires and antifuses W12, L1, W13, L2, W14, L3, W15, L4, L5, W17, W16, L6, W18, L7, and W19 may form net 24 of FIG. 2B in the programmable device of FIG. 1.

Next, in step 43, a default programming method is chosen for each antifuse to be programmed. In certain embodiments of the present invention, the default programming method for all antifuses is a two-branch programming method. Other programming methods, including three-branch programming, four-branch programming, et cetera, are used for the default programming method in other embodiments. In still other embodiments, some antifuses have a first default programming method whereas other antifuse have a second default programming method.

Next, in step 44, each of the antifuses to be programmed is classified to determine the approximate resistance of each antifuse after programming. The first time this classification step is performed, a default programming method is assumed for each of the antifuses to be programmed. In this classification step, each antifuse to be programmed is first classified according to three properties. The possible choices for the three properties are set forth in Table 1 below.

Type and Location of Antifuse:
  Cross antifuse to left of a module.
  Cross antifuse elsewhere.
  Vertical pass antifuse.
  Horizontal pass antifuse.
Express Wire Usage:
  Cross antifuse connected to no express wires.
  Pass antifuse connected to no express wires.
  Cross antifuse to left of module connected to one vertical express wire.
  Cross antifuse elsewhere connected to one vertical express wire.
  Cross antifuse elsewhere connected to one horizontal express wire.
  Cross antifuse elsewhere connected to two express wires.
  Pass antifuses connected to a helper antifuse and to an express wire.
Number and Type of Programming Branches:
  Cross antifuses connected to two programming branches coming from the two closest sides of the die.
  Cross antifuses connected to three programming branches coming from the two closest sides and the farthest side of the die.
  Cross antifuses connected to three programming branches coming from the one, two or three closest sides of the die.
  Cross antifuses connected to four programming branches.
  Pass antifuses connected to two programming branches.
  Pass antifuses connected to a helper antifuse and connected to three programming branches.
  Pass antifuses connected to a helper antifuse and connected to four programming branches.

Table 1

The term "helper" antifuse used in Table 1 refers to an antifuse which must not necessarily be programmed to form the required nets of the user-specific circuit. Rather, a helper antifuse may only be programmed in order to enable one or more additional programming branches to be connected to a programming branch so that the additional programming branch or branches can be used in the programming of an antifuse. If, for example, antifuse L13 of FIG. 1A were to be programmed and a two branch programming path method from programming driver PD8, down to antifuse L13, and from antifuse L13, across to programming driver PD7 were inadequate, then a third programming branch could be added by using cross antifuse L10. By programming cross antifuse L10, turning pass transistor PT9 on, and then driving programming driver PD6 with the same programming voltage that is being driven by programming driver PDS, a third programming branch is connected to the programming branch extending from programming driver PD8 down to antifuse L13. This additional programming branch extends from programming driver PD6, through pass transistor PT9, and to helper cross antifuse L10. Note that this programmed helper cross antifuse L10 serves no function in the operation of the user-specific circuit of FIGS. 2A and 2B during normal circuit operation after the user-specific circuit has been programmed into the programmable device. The voltage on horizontal wire W22 rises and falls with the voltage on the net from flip-flop FF2 to AND gate AND2, but wire W22 is disconnected from the rest of the programmable device by nonconductive pass transistors PT8 and PT9 and unprogrammed pass antifuses L18 and L11.

Figure 1A:
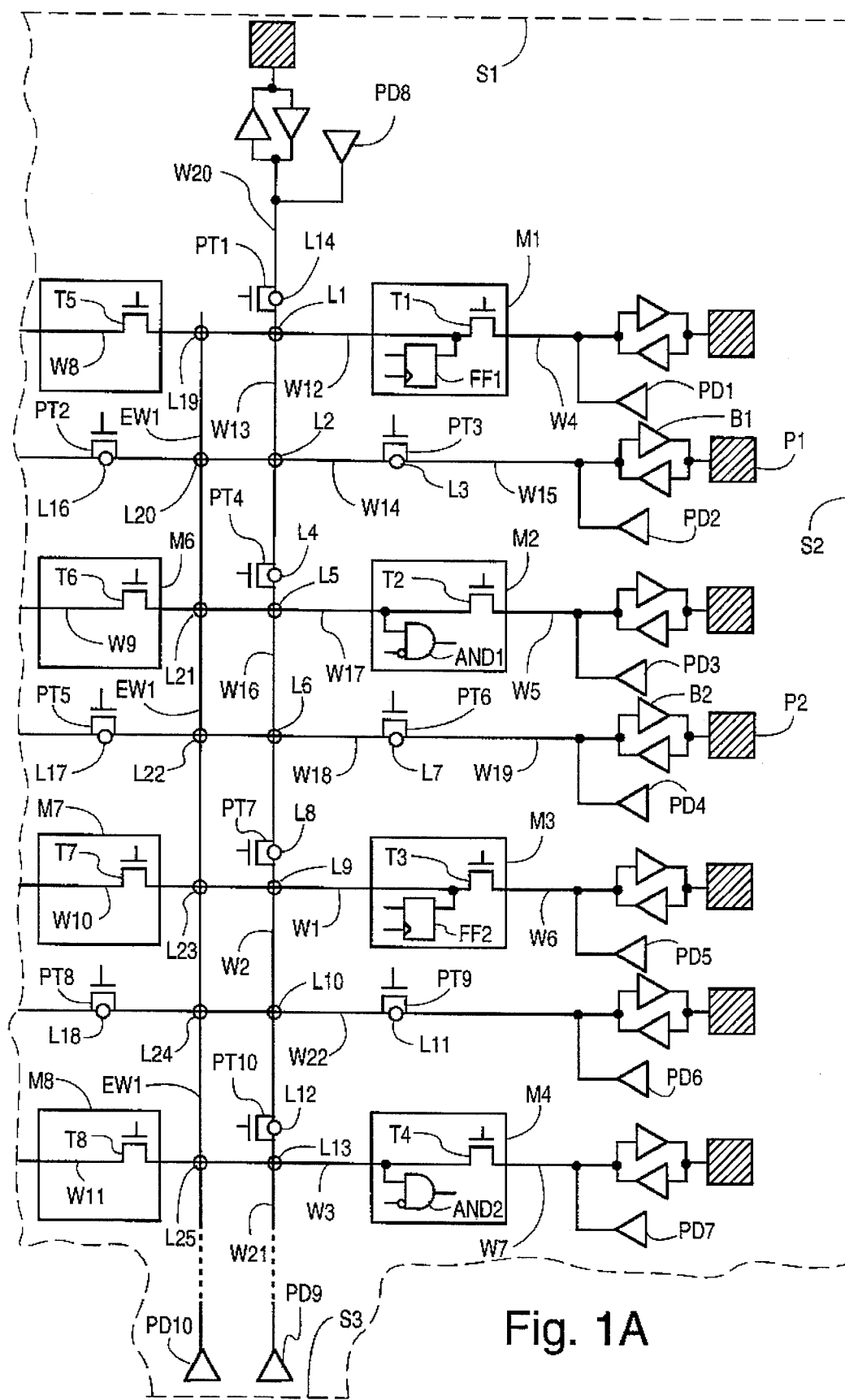
FIG. 1A is a simplified view of the upper right corner of a programmable device.
Figure 1B:
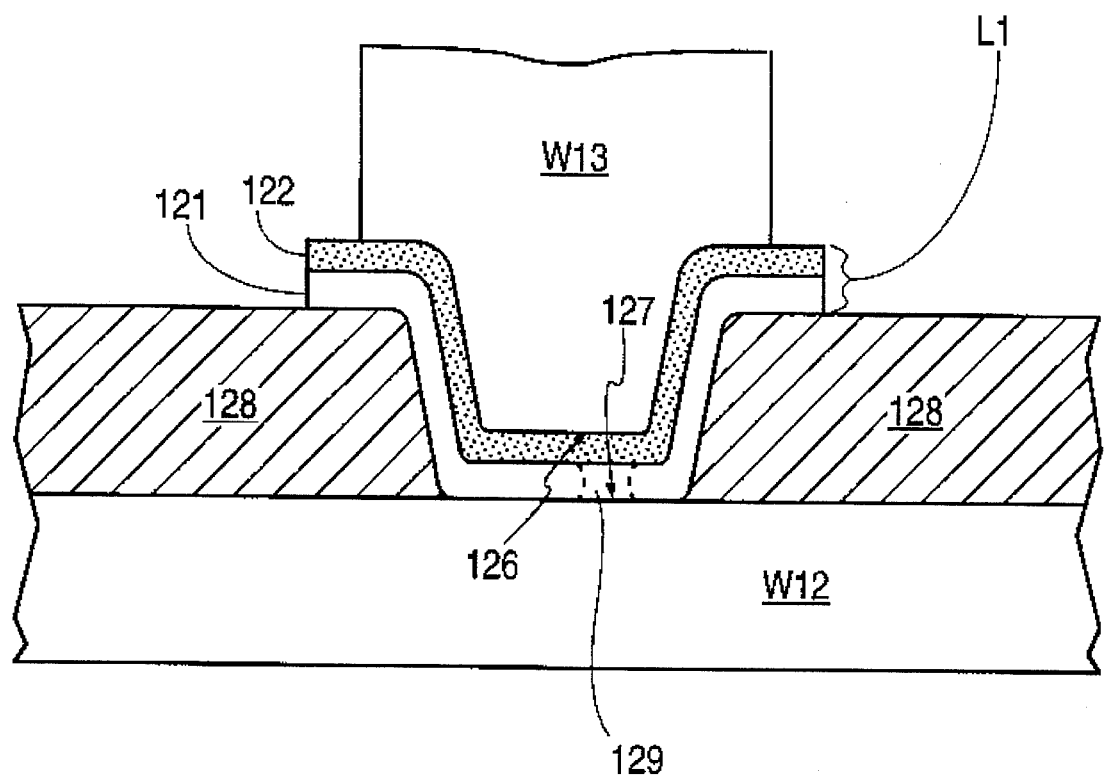
FIG. 1B is a cross sectional view of one embodiment of a cross antifuse disposed in the programmable device of FIG. 1A FIGS. 2A and 2B together show a user-specific circuit to be realized in the programmable device of FIG. 1A.
Figure 2A:
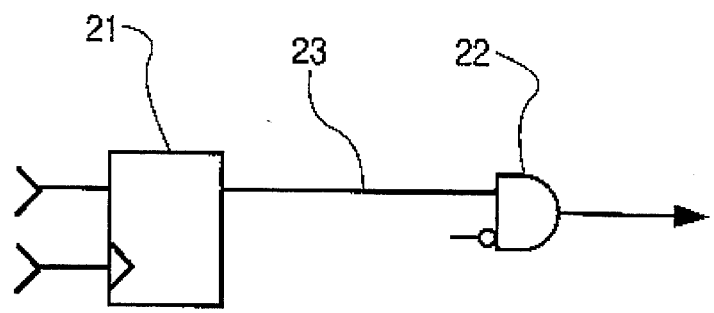
Figure 2B:
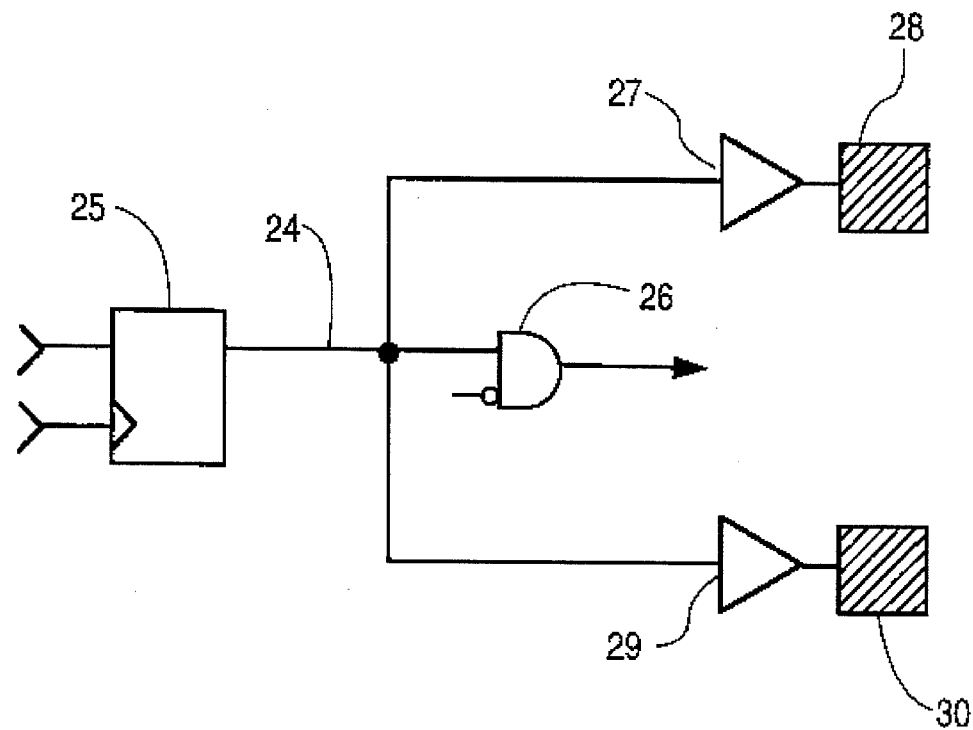

The properties and multiple choices listed above in Table 1 are particularly programmed resistance-determinative properties and choices for antifuses disposed in a programmable device such as the programmable device of FIG. 1A. It is to be understood, however, that various other properties and/or choices may be used to characterize antifuses in the programmable device of FIG. 1A as well as other programmable devices. The particular properties and choices shown above in FIG. 1A are presented here merely to illustrate one possible embodiment of the classification step in accordance with one embodiment of the present invention.

Note that the type of programming method chosen determines the choice under the third property of Table 1, the Number and Type of Programming Branches property. The first time step 44 is performed, a default programming method is assumed for all antifuses. In some embodiments, this default programming method is a two branch programming path method.

For each possible combination of choices of the above antifuse properties which makes sense, there is a table and/or an approximating equation representative of a table. By classifying antifuses to be programmed by the above properties and choices, an appropriate table or equation is identified for each antifuse to be programmed. An example of a combination of the above properties and choices which does not make sense for the programmable device of FIG. 1A is a cross antifuse located to the left of a module with two express wires.

Next, in step 45, after the appropriate table or equation is identified for each classified antifuse, the estimated resulting programmed resistance of each antifuse is found by supplying correct values for the variables of the identified table or equation. The following Table 2 lists the variables for the tables or equations of one possible embodiment of the present invention.

Variables For Cross Antifuse Tables Are:
  Vertical column number for wires containing the antifuse.
  Horizontal row number for wires containing the antifuse.

Variables For Pass Antifuses Connected To A Helper Antifuse Are:
  Vertical column number for wires containing helper antifuse.
  Horizontal row number for wires containing helper antifuse.

Variables For Pass Antifuses Without Helper Antifuses Are:
  Vertical antifuse.
  Horizontal antifuse.

Table 2

The result of inputting the appropriate variable values into the identified table or equation for each antifuse to be programmed is an estimated resulting programmed antifuse resistance.

Next, in step 46, a peak programming current which would flow through an antifuse if the antifuse were being programmed according to an assumed programming method is determined. The first time this programming current determining step 46 is performed, the programming current is determined assuming that all antifuses to be programmed are to be programmed using a default programming method.

Figure 5:
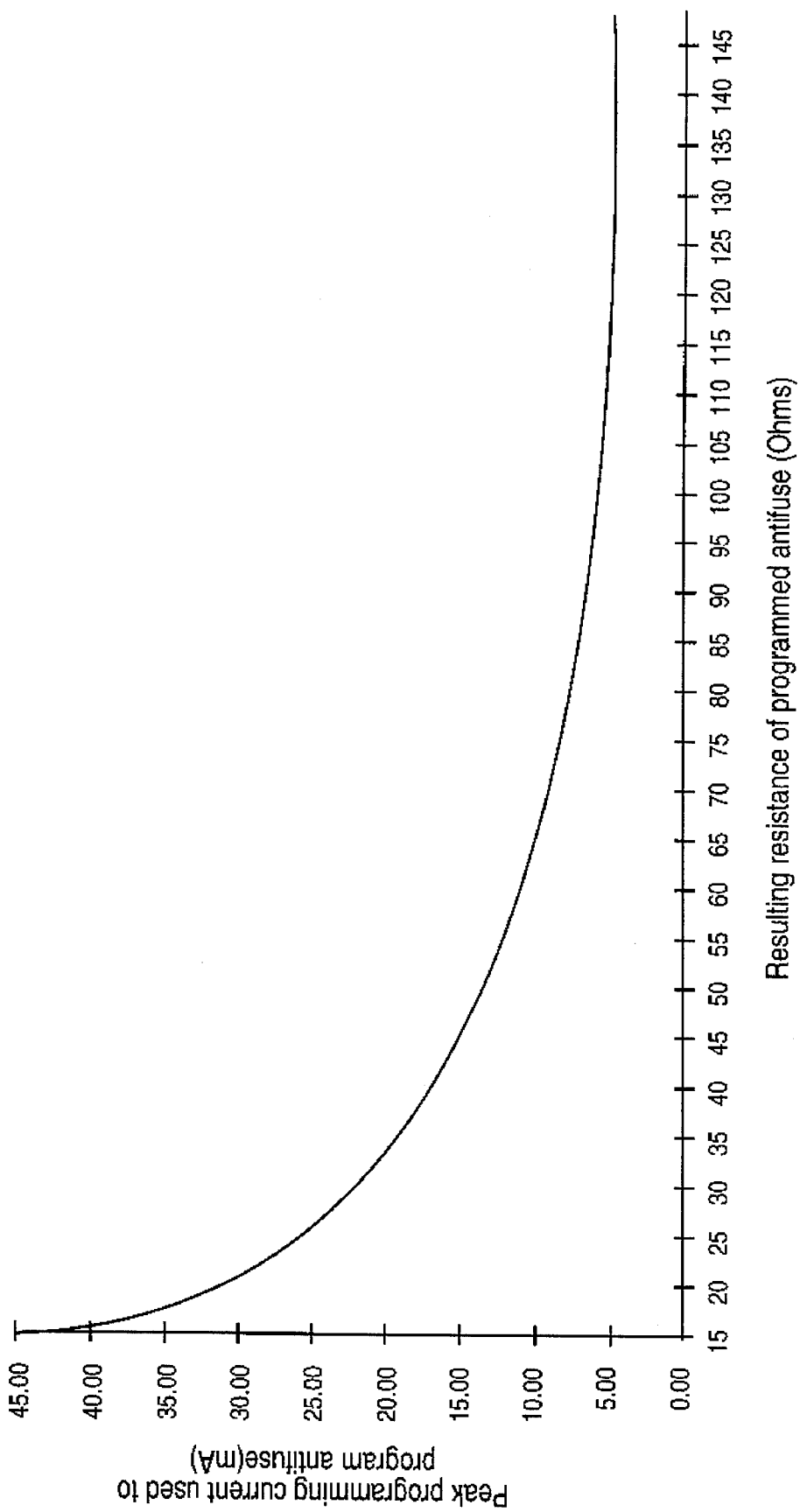
FIG. 5 is a graph showing a relationship between the resulting resistance of a programmed antifuse and the peak programming current used to program that antifuse.

The peak programming current may, for example, be determined from empirical data. FIG. 5, for example, is a graph relating the measured resulting resistance of a certain type of amorphous silicon antifuse to a peak programming current used to program the antifuse. From the known resulting resistance, the peak programming current may be found using an empirically determined curve such as the curve of FIG. 5.

Next, in step 47, the peak operating current which would flow through each antifuse to be programmed is determined assuming the antifuse were already programmed. The first time this step is performed, all antifuses are assumed to have been programmed with a default programming method. A circuit simulation program such as SPICE or RICE may be used to in this step. The RICE simulation program is a program developed by Professor Pillage of the University of Texas which implements the AWE (asymptotic waveform evaluation) technique. The net containing the antifuse being examined is modeled and then simulated to determine the operating current which would flow through the antifuse being examined if a driver driving the net containing the antifuse switches the voltage level on the net during normal circuit operation. Any drivers driving the net, wires comprising the net, unprogrammed antifuses connected to the net, programmed antifuses disposed in the net, pass transistors connected to the net, or inputs to logic circuitry being driven by the net may, for example, be represented in the simulation using resistances and capacitances representative of those elements. Because the operating current flowing through each programmed antifuse is examined assuming that the antifuse is already programmed using a programming method, the resistance and/or capacitance used to represent the antifuse in the simulation can be chosen using the previously determined programmed antifuse resulting resistance.

Next, in step 48, a sequencer program generates an ordered list which indicates 1) which antifuses to be programmed will be programmed before which other antifuses to be programmed, and 2) which transistors are to be on, which transistors are to be off, and which programming drivers are to be controlled to drive what programming voltage in order to accomplish the programming. The programming method assumed by the sequencer to program each antifuse is the programming method assigned to the antifuse in the previous steps. If, for example, the sequence of steps of FIG. 4 is being run the first time, no step will have changed the programming method of any antifuse to be programmed from the default method. If, in step 48, the sequencer is unable to generate an order of antifuse programming which would result in the routing of all the user's nets using the programming methods dictated by the previous steps, then the sequencer fails and the design is rerouted. If, on the other hand, the sequencer successfully generates an order of programming by which the routed nets can be realized with the desired programming methods, then the sequencer has not failed and process flow continues to a design rule check step 49.

Next, in step 49, a design rule test is performed to determine whether each of the antifuses to be programmed, if programmed as indicated by the sequencer, would meet a design rule. In the presently described embodiment of FIG. 4, this design rule test is a comparison of the peak operating current determined in step 47 to the peak programming current determined in step 46. If the peak operating current divided by the peak programming current exceeds a given number, then the antifuse is identified as an antifuse which will likely undergo a change in resistance during normal circuit operation. If, on the other hand, the peak operating current divided by the peak programming current does not exceed the given number, then the antifuse is not identified as an antifuse which will likely undergo a change in resistance during normal circuit operation. It is to be understood, however, that multiple other design rule tests including simple and/or complex relationships involving currents, voltages, resistances, programming times, antifuse characteristics, et cetera may be used according to the present invention in the determination of whether a certain antifuse would undergo a change in resistance during normal circuit operation if programmed using a certain programming method.

If an antifuse to be programmed fails the design rule test step 49, then the programming method assumed to program the antifuse will be changed in step 50 to increase the programming current. If, on the other hand, the antifuse to be programmed passes the design rule test step 49, then the programming method for that antifuse is deemed adequate and is not changed. The antifuses to be programmed are then programmed as indicated by the output of the sequencer.

After the selecting step 50 is performed for an antifuse which failed the design rule test step 49, steps 44–48 are repeated, and the design rule is again tested in step 49. This process continues until all antifuses to be programmed have programming methods assigned to them which do not result in the design rule being violated and which can be performed as indicated by the sequencer.

In the case of the realization of the circuit of FIGS. 2A and 2B in the programmable device of FIG. 1A, the placement and routing of the circuitry and nets is performed as described above. In step 43, a default programming method is initially assumed for all the antifuses to be programmed in the routed nets. The description below illustrates an operation of the sequence of steps of FIG. 4, using antifuses L1 and L9 of the placed and routed circuits of FIGS. 2A and 2B as an example. Note that cross antifuses L1 and L9 are each disposed in a net between a flip-flop and an AND gate. The net of antifuse L1 differs from the net of antifuse L9 in that a larger capacitive load exists on the net of antifuse L1 than exists on the net of antifuse L9. Cross antifuses L1 and L9 have a substantially identical physical structure before programming.

If the default programming method of antifuse L1 is a two-branch programming path method, antifuse L1 may be programmed by turning on transistors T1 and PT1, controlling programming driver PD8 to drive wire W20 to the programming voltage Vpp, and controlling programming driver PD1 to drive wire W4 to ground. One programming branch of the programming path extends from antifuse L1, to the right through wire W12, through transistor T1, through wire W4, and to programming driver PD1. A second branch extends from antifuse L1, upward through wire W13, through transistor PT1, through wire 20, and to programming transistor PD8.

Similarly, if the default programming method of antifuse L9 is a two-branch programming path method, transistors T3 and PT10 may be turned on, programming driver PD5 may be controlled to output the programming voltage Vpp, and programming driver PD9 may be controlled to output a ground voltage. One programming branch of the two-branch programming path extends from antifuse L9, to the right through wire W1, through transistor T3, through wire W6, and to programming driver PD5. A second branch extends from antifuse L9, downward through wire W2, through transistor PT10, through wire 21, and so forth through wires and transistors (not shown), to programming driver PD9.

In step 44, antifuses L1 and L9 are classified according to the properties of Table 1. Antifuse L1 is 1) a cross antifuse located to the left of a module M1, 2) is a cross antifuse connected to no express wire, and 3) is a cross antifuse connected to two programming branches coming from the two closest sides S1 and S2 of the die of the programmable device. Antifuse L9 is 1) a cross antifuse located to the left of a module M3, 2) is a cross antifuse connected to no express wire, and 3) is a cross antifuse connected to two closest sides S2 and S3 of the die. The classification step therefore identifies the same table or equation for both antifuses L1 and L9.

In step 45, the appropriate variable values of Table 2 are supplied to the table or equation identified in step 44. Cross antifuse L1 is located at the intersection of the first column from the right side S2 of the die and the first row down from the top side S1 of the die. Cross antifuse L9 is located at the intersection of the of the first column from the right side S2 of the die and the third row down from the top side S1 of the die. The result of step 45 is a determined programmed antifuse resulting resistance for antifuse L1 of 44 ohms and a determined programmed antifuse resulting resistance for antifuse L9 of 45 ohms.

In step 46, the peak programming currents which would flow through antifuses L1 and L9 are determined assuming the two-branch default programming methods. By referring to the graph of FIG. 5, the 44 ohm programmed resulting resistance of antifuse L1 corresponds with a 16 mA peak programming current, whereas the 45 ohm programmed resulting resistance of antifuse L9 corresponds with a 15 mA peak programming current.

Figure 3A:
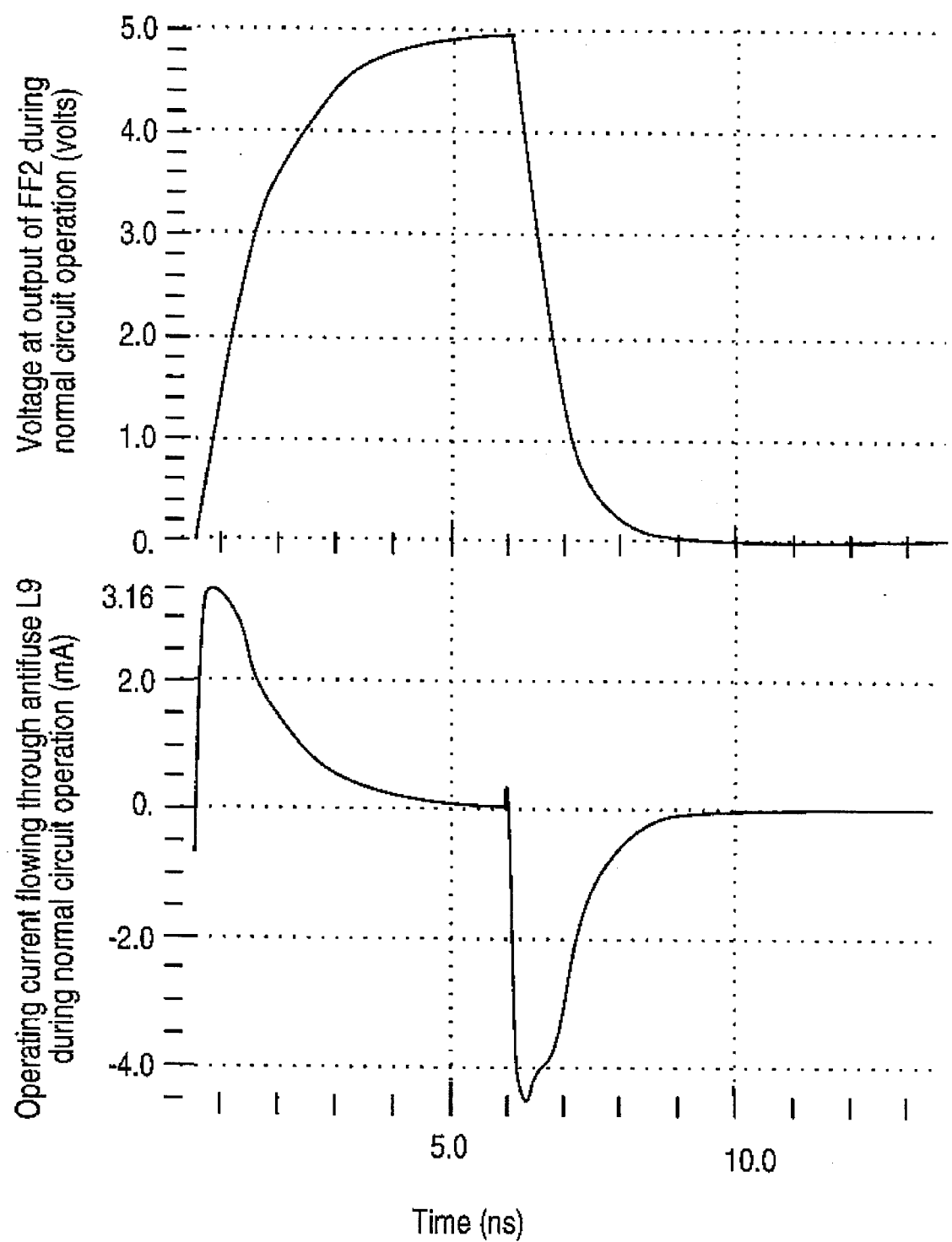
FIG. 3A depicts an operating current which flows through a first programmed antifuse in the programmable device of FIG. 1A.
Figure 3B:
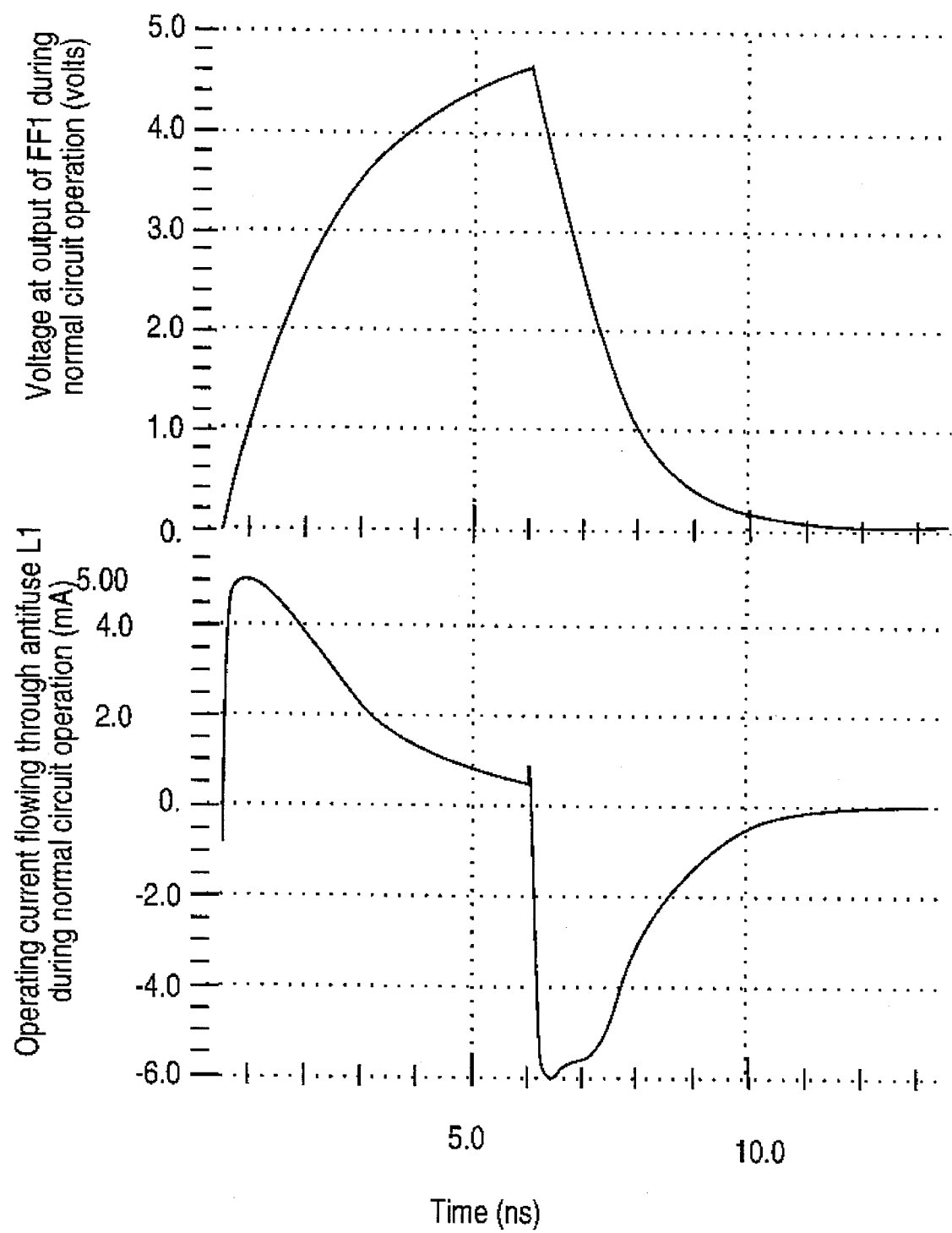
FIG. 3B depicts an operating current which flows through a second programmed antifuse in the programmable device of FIG. 1A.

In step 47, the peak operating current which would flow through antifuses L1 and L9 during normal circuit operation is determined using a circuit simulation program. The resistance of antifuses L1 and L9 used in the circuit simulation are the 44 ohms and 45 ohms determined above in step 45. FIG. 3B shows the operating current which would flow through antifuse L1 including the peak operating current of 5.00 mA. FIG. 3A shows the current which would flow through antifuse L9 including the peak operating current of 3.46 mA.

After a sequencer program is run in step 48, a design rule is tested in step 49 for each of antifuses L1 and L9. This design rule requires that the peak operating current divided by the peak programming current not exceed the value of 0.7 for any antifuse to be programmed. As previously determined in steps 44–47, antifuse L9 has a peak operating current of 3.46 mA and a peak programming current of 15 mA. The ratio of these currents is 0.23 so the design rule is not violated and the programming method of antifuse L9 need not be changed. As previously determined in steps 44–47, antifuse L1 has a higher peak operating current of 5.00 mA and a peak programming current of 16 mA. Despite the fact that the ratio 0.3125 of these currents is higher for antifuse L1 than it is for antifuse L9, the ratio is below 0.7 and the design rule is not violated. The default programming method is therefore adequate to program antifuse L1.

If, however, additional capacitance were to be connected to the portion of the net between antifuse L1 and AND gate AND1, for example, then the peak operating current flowing through antifuse L1 would increase during switching of the output of flip-flop FF1 to the point where the design rule would be violated. In this case, design rule test step 49 would fail and the programming method assumed to be used in the programming of antifuse L1 would be changed in step 50 from the default two-branch programming path method. Accordingly, only higher programming current programming methods could be used in the next pass of the sequencer. After proceeding through steps 44–47 a second time, and after successful completion of the second pass of the sequencer in step 48, the design rule test would again be performed. This time, however, the peak programming current would be higher due to the use of a higher programming current method. Such a higher programming method may, for example, be a three-branch programming path method whereby programming driver PD9 is driven with the programming voltage Vpp and transistors PT10, PT7, and PT4 are turned on during programming of antifuse L1 so that a third branch extending from antifuse L1 to programming driver PD9 is established. If the peak programming current is increased enough by the use of the new programming method, the design rule test step 49 is not violated and the sequence of steps of FIG. 4 is completed after antifuse programming.

In the above described situation, one antifuse (antifuse L9) is programmed with a first programming method (such as a two-branch programming method) whereas a second antifuse (antifuse L1) is programmed with a second programming method (a programming method having a higher programming current than is possible with the two-branch programming method). Both of these two antifuses are programmed so that a design rule is not violated. The two antifuses are, however, programmed such that had the second antifuse (antifuse L1) been programmed using the first programming method (the two-branch programming method), then the second antifuse (antifuse L1) would have violated the design rule.

In accordance with one embodiment of the invention, each already programmed antifuse of a programmable device has a maximum permissible operating current. This maximum permissible operating current is related to the particular design rule for the programmable device. Supposing, for example, that the design rule requires that the operating current flowing through an antifuse not exceed 0.7 times the peak programming current used the program the antifuse, and further supposing that an antifuse was programmed with a peak programming current of 30.0 mA, then the maximum permissible operating current of this antifuse would be 21.0 mA. A programmed programmable device, in accordance with one embodiment of the invention, comprises a first antifuse having a first maximum permissible operating current $I_{1poc}$ as well as a second antifuse having a second maximum permissible operating current $I_{2poc}$. These first and second antifuses have a substantially identical unprogrammed physical structure. The first and second antifuses may, for example, both be cross antifuses or both be pass antifuses. Operating currents $I_{1aoc}$ and $I_{2aoc}$ in this programmed programmable device flow through each of the first and second programmed antifuses respectively such that the design rule is not violated during normal circuit operation by either of the antifuses. The peak operating current conducted by the second antifuse is greater than the maximum operating current of the first antifuse such that $I_{1aoc} \leq I_{1poc} < I_{2aoc} \leq I_{2poc}$. In some embodiments, the first and second antifuses are disposed in two separate nets. In other embodiments, the first and second antifuses are disposed in the same net.

In still another embodiment, the already programmed programmable device comprises a third programmed antifuse, wherein the third antifuse has a third maximum permissible operating current $I_{3poc}$, as well as an actual operating current $I_{3aoc}$, wherein $I_{1aoc} \leq I_{1poc} < I_{2aoc} \leq I_{2poc} < I_{3aoc} \leq I_{3poc}$. The first, second and third programmed antifuses all have an identical unprogrammed physical structure.

Accordingly, the present invention allows antifuses of a field programmable gate array device to be programmed with an adequately high programming current so that the resultant programmable device has an increased reliability during normal circuit operation while simultaneously allowing antifuses which do not require a high programming current programming method to be programmed using a lower programming current method. As a result, the present invention facilitates the programming of reliable user-specific circuit realized in programmable devices.

Although the present invention has been described in connection with certain specific embodiments for illustrative purposes, the present invention is not limited thereto. The sequence of steps of FIG. 4, for example, is but one embodiment of a method according to the present invention. The order of the various steps of FIG. 4 may be changed, various steps may be omitted, and additional steps may be added. The present invention is also not limited to the programming of programmable devices in accordance with design rules which govern relationships between operating current and programming current. The present invention may be used to program programmable devices in accordance with other design rules. The design rule employed in the present invention, for example, need not directly relate to improving the reliability of programmed devices after programming under normal circuit operation. It is to be understood, therefore, that various changes, modifications, and adaptations of the above described embodiments may be practiced without departing from the spirit and scope of the invention as set forth in the appended claims.

I claim:

1. A programmable device, comprising:
    a first net comprising a first programmed antifuse, said first programmed antifuse having a first maximum permissible operating current $I_{1poc}$, a first peak actual operating current $I_{1aoc}$ flowing through said first programmed antifuse during switching of said first net during normal circuit operation; and
    a second net comprising a second programmed antifuse, each of said first and second programmed antifuses having a substantially identical unprogrammed structure, said second programmed antifuse having a second maximum permissible operating current $I_{2poc}$, a second peak actual operating current $I_{2aoc}$ flowing through said second programmed antifuse during switching of said second net during normal circuit operation, wherein $I_{1aoc} \leq I_{1poc} < I_{2aoc} \leq I_{2poc}$.

2. The programmable device of claim 1, wherein said first maximum permissible operating current $I_{1poc}$ is a current level above which electrical characteristics of said first antifuse change at least initially during normal circuit operation, and wherein said second maximum permissible operating current $I_{2poc}$ is a current level above which electrical characteristics of said second antifuse change at least initially during normal circuit operation.

3. The programmable device of claim 2, wherein said electrical characteristics of said first antifuse include a resistance, and wherein said electrical characteristics of said second antifuse include a resistance.

4. The programmable device of claim 3, wherein said first programmed antifuse comprises amorphous silicon and wherein said second programmed antifuse comprises amorphous silicon.

5. The programmable device of claim 1, said first programmed antifuse having been programmed with a first programming current $I_{1pc}$, wherein:

$I_{1poc} = C \, I_{1pc}$, and said second programmed antifuse having been programmed with a second programming current $I_{2pc}$, wherein:

$I_{2poc} = C \, I_{2pc}$.

6. The programmable device of claim 4, wherein said first programming current $I_{1pc}$ is a peak programming current, and wherein said second programming current $I_{2pc}$ is a peak programming current.

7. The programmable device of claim 4, wherein C is a predetermined constant having a value of approximately 0.7 to 0.9.

8. The programmable device of claim 7, wherein said first programmed antifuse and said second programmed antifuse comprise amorphous silicon.

9. The programmable device of claim 7, wherein said first programmed antifuse comprises amorphous silicon and wherein said second programmed antifuse comprises amorphous silicon.

10. The programmable device of claim 1, further comprising:

a third net comprising a third programmed antifuse, each of said first, second and third programmed antifuses having a substantially identical unprogrammed structure, said third programmed antifuse having a third maximum permissible operating current $I_{3poc}$, a third peak actual operating current $I_{3aoc}$ flowing through said third programmed antifuse during switching of said third net during normal circuit operation, wherein $I_{1aoc} \leq I_{1poc} < I_{2aoc} \leq I_{2poc} < I_{3aoc} \leq I_{3poc}$.

11. The programmable device of claim 10, wherein said first programmed antifuse, said second programmed antifuse and said third programmed antifuse comprise amorphous silicon.

12. The programmable device of claim 10, wherein said first programmed antifuse comprises amorphous silicon, wherein said second programmed antifuse comprises amorphous silicon, and wherein said third programmed antifuse comprises amorphous silicon.

13. The programmable device of claim 1, wherein said first programmed antifuse and said second programmed antifuse comprise amorphous silicon.

14. The programmable device of claim 1, wherein said first programmed antifuse comprises amorphous silicon and wherein said second programmed antifuse comprises amorphous silicon.

15. A programmable device, comprising:

a first programmed antifuse having a first maximum permissible operating current $I_{1poc}$, a first peak actual operating current $I_{1aoc}$ flowing through said first programmed antifuse during normal circuit operation; and a second programmed antifuse, each of said first and second programmed antifuses having a substantially identical unprogrammed structure, said second programmed antifuse having a second maximum permissible operating current $I_{2poc}$, a second peak actual operating current $I_{2aoc}$ flowing through said second programmed antifuse during normal circuit operation, wherein $I_{1aoc} \leq I_{1poc} < I_{2aoc} \leq I_{2poc}$.

16. The programmable device of claim 15, wherein both said first and second programmed antifuses are disposed in a single net during normal circuit operation.

17. The programmable device of claim 15, wherein said first programmable antifuse is disposed in a first net during normal circuit operation, and wherein said second programmable antifuse is disposed in a second net during normal circuit operation.

18. The programmable device of claim 15, wherein said first programmed antifuse and said second programmed antifuse comprise amorphous silicon.

19. The programmable device of claim 15, wherein said first programmed antifuse comprises amorphous silicon and wherein said second programmed antifuse comprises amorphous silicon.

20. A method, comprising the steps of:

identifying a first antifuse to be programmed which would violate a design rule during normal circuit operation if programmed with a first programming method;

programming said first antifuse with a second programming method so that said design rule is not violated during normal circuit operation;

identifying a second antifuse to be programmed which would not violate said design rule during normal circuit operation if programmed with said first programming method; and programming said second antifuse with said first programming method so that said design rule is not violated during normal circuit operation, said first and second antifuses having a substantially identical unprogrammed structure, said first and second antifuse being disposed on the same programmable device.

21. The method of claim 20, wherein said design rule requires that current flow during normal circuit operation through an antifuse subject to said design rule does not cause a resistance of said antifuse to undergo a substantial change during normal circuit operation.

22. The method of claim 21, wherein first antifuse and said second antifuse comprise amorphous silicon.

23. The method of claim 20, wherein said design rule requires that current flow during normal circuit operation through an antifuse subject to said design rule does not exceed a predetermined fraction of a peak programming current used to program said antifuse.

24. The method of claim 20, wherein said first programming method is a two branch programming path method, and wherein said second programming method is a three branch programming path method.

25. The method of claim 20, wherein first antifuse and said second antifuse comprise amorphous silicon.

26. The method of claim 20, wherein said first programming method is an A branch programming path method and said second programming method is a B branch programming path method, A and B being integers, and wherein A<B.

27. The method of claim 20, wherein said first antifuse comprises amorphous silicon and wherein said second antifuse comprises amorphous silicon.

28. A method, comprising the steps of:
   (a) determining antifuses in a field programmable device which are to be programmed;
   (b) after step (a), determining a programming current through one of said antifuses to be programmed assuming a first method of programming;
   (c) after step (a), determining an operating current through said one antifuse assuming said first method of programming; and
   (d) using said programming current determined in step (b) and said operating current determined in step (c) in a design rule test; and
   (e) changing said first method of programming for said one antifuse based on a result of said design rule test.

29. The method of claim 28, wherein said first method of programming is changed in step (e) if said operating current determined in step (c) divided by said programming current determined in step (b) exceeds a number C.

30. The method of claim 29, wherein step (e) further comprises the steps of repeating steps (b), (c) and (d), thereby increasing said programming current for said antifuse.

31. The method of claim 30, further comprises the step of:
   (f) indicating to a sequencer program permissible programming methods usable to program said antifuse.

32. The method of claim 28, wherein steps (a), (b), (c), (d) and (e) occur before said one antifuse is programmed.

33. The method of claim 28, wherein said antifuses in said field programmable device which are to be programmed comprise amorphous silicon.

34. The method of claim 28, wherein each of said antifuses comprises amorphous silicon.

* * * * *